(12) United States Patent
Masumoto et al.

(10) Patent No.: US 10,677,585 B2
(45) Date of Patent: Jun. 9, 2020

(54) FILM THICKNESS MEASURING APPARATUS

(71) Applicant: Mitsubishi Electric Corporation, Tokyo (JP)

(72) Inventors: Yuichi Masumoto, Tokyo (JP); Toru Jokaku, Tokyo (JP); Nobuaki Yamanaka, Tokyo (JP); Yosuke Nakanishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/266,123

(22) Filed: Feb. 4, 2019

(65) Prior Publication Data
US 2019/0310074 A1 Oct. 10, 2019

(30) Foreign Application Priority Data

Apr. 9, 2018 (JP) .................. 2018-074641

(51) Int. Cl.
*G01B 11/06* (2006.01)
*H01L 21/67* (2006.01)
*H01L 21/66* (2006.01)

(52) U.S. Cl.
CPC .... *G01B 11/0625* (2013.01); *H01L 21/67253* (2013.01); *H01L 22/12* (2013.01); *G01B 2210/56* (2013.01)

(58) Field of Classification Search
CPC .............. G01B 11/06; G01B 11/0625; G01B 2210/56; H01L 21/67253; H01L 22/12

USPC ......................................... 356/632
See application file for complete search history.

(56) References Cited

U.S. PATENT DOCUMENTS

| 3,807,870 | A | * | 4/1974 | Kalman | ................. | G01B 11/06 |
| | | | | | | 356/630 |
| 4,984,894 | A | * | 1/1991 | Kondo | ............... | G01B 11/0625 |
| | | | | | | 250/372 |
| 5,604,581 | A | * | 2/1997 | Liu | .................... | G01B 11/0625 |
| | | | | | | 356/632 |
| 5,717,490 | A | * | 2/1998 | Kumar | ............... | G01B 11/0625 |
| | | | | | | 356/630 |

(Continued)

FOREIGN PATENT DOCUMENTS

| JP | 63-090704 A | 4/1988 |
| JP | 11-230860 A | 8/1999 |
| JP | 2017-211293 A | 11/2017 |

*Primary Examiner* — Roy M Punnoose
(74) *Attorney, Agent, or Firm* — Studebaker & Brackett PC (57) ABSTRACT

An occurrence of a noise in a light receiver is suppressed, and an accuracy of measuring a film thickness is improved. A film thickness measuring apparatus includes: a stage being in contact with only an end portion of a substrate; a reflection suppressing unit located separately from the stage in a region surrounded by the stage; a light source; and a light receiver which a first light made up of light, which has been emitted from the light source, reflected on an upper surface of the measured film and a second light reflected on an upper surface of the substrate enter. The reflection suppressing unit is located separately from a lower surface of the substrate exposed to atmosphere, and suppresses a reflection of light, which enters the reflection suppressing unit from the light source, to the light receiver.

11 Claims, 4 Drawing Sheets

(56) References Cited

U.S. PATENT DOCUMENTS

| | | | | |
|---|---|---|---|---|
| 5,748,091 A * | 5/1998 | Kim | ................. | G08B 19/02 |
| | | | | 244/134 F |
| 5,754,294 A * | 5/1998 | Jones | ................. | G01B 11/06 |
| | | | | 356/432 |
| 6,108,077 A * | 8/2000 | Heaton | ............ | G01N 21/9501 |
| | | | | 356/213 |
| 6,166,819 A * | 12/2000 | Schnabel | .......... | G01B 11/0675 |
| | | | | 356/504 |
| 6,573,999 B1 * | 6/2003 | Yang | ............ | G01B 11/0625 |
| | | | | 356/630 |
| 8,300,232 B2 * | 10/2012 | Sansom | ........... | G01B 11/0616 |
| | | | | 356/485 |
| 9,400,172 B2 * | 7/2016 | Hattori | ............ | G01B 11/0625 |
| 2018/0226246 A1 * | 8/2018 | Hamano | .............. | C30B 29/36 |
| 2019/0101373 A1 * | 4/2019 | Ghim | .............. | G01B 9/02015 |

* cited by examiner

FILM THICKNESS MEASURING APPARATUS

BACKGROUND OF THE INVENTION

Field of the Invention

A technique disclosed in a specification of the present application relates to an optical film thickness measuring apparatus, for example.

Description of the Background Art

In manufacturing a semiconductor element typified by an integrated circuit (that is to say, IC) or a memory, a thermal $SiO_2$ film or a Poly-Si film is formed on a surface of an Si substrate, and an element is further formed by a pattern formation by photoengraving process and etching.

In the process described above, a film thickness is measured using an optical film thickness measuring system to confirm whether or not the film formed on the surface of the Si substrate has a desired film thickness (see Japanese Patent Application Laid-Open No. 2017-211293, Japanese Patent Application Laid-Open No. 11-230860, and Japanese Patent Application Laid-Open No. 63-90704, for example).

Herein, as a measurement principle of the film thickness measurement using an optical interference film thickness measuring system, a measurement light (for example, a visible light) is emitted, and a reflected light on a surface of a measured film and a reflected light, which has passed through the measured film, on a surface of the Si substrate which is a base are received by a sensor. Then, a phase difference (interference effect) between those types of reflected light is converted to measure the film thickness.

At this time, if the base is a sample made of a material which hardly transmits the measurement light such as the Si substrate, the film thickness of the film formed on the surface of the Si substrate can be accurately measured, however, if the base is a sample made of a material which transmits the measurement light such as an SiC substrate, a reflected light from a measurement stage on which the sample is disposed has an influence on a light receiver of the sensor, thereby causing a reduction in a measurement accuracy. Herein, the influence of the reflected light on the light receiver of the sensor indicates a noise (disturbance) incorporated into a result of the film thickness measurement, for example.

SUMMARY

In a conventional film thickness measuring apparatus, if a substrate having a measured film is made of a material transmitting an incident light, the incident light passes through the substrate and is then reflected on an upper surface of a measurement stage on which the substrate is disposed, and a reflected light reaches a light receiver of the sensor. This causes a problem that the reflected light has an influence on the light receiver of the sensor, and the film thickness of the measured film cannot be accurately measured.

In Japanese Patent Application Laid-Open No. 2017-211293, for example, a low reflection body is provided on a surface of a measurement stage to reduce a reflected light at an interface between a substrate having a measured film and the measurement stage so that an accuracy of measuring a film thickness of a film formed on a surface of a transparent substrate is improved.

However, the light entering the low reflection body is not entirely absorbed but reflected to no small extent, thus there is a concern that the reflected light causes a noise in the measurement in the light receiver of the sensor.

An object of a technique disclosed in the specification of the present application is to provide a technique for suppressing an occurrence of a noise in a light receiver and improving an accuracy of measuring a film thickness even if light from a light source passes through a measured film and further passes through a substrate.

A first aspect of a technique disclosed in the specification of the present application is a film thickness measuring apparatus measuring a film thickness of a measured film formed on an upper surface of a substrate transmitting light, including: a stage being in contact with only an end portion of the substrate in a planar view and supporting the substrate from below; a reflection suppressing unit located separately from the stage below the stage, at least a part of the reflection suppressing unit located in a region surrounded by the stage in a planar view; a light source emitting light to the measured film; and a light receiver which a first light made up of light, which has been emitted from the light source, reflected on an upper surface of the measured film and a second light made up of light, which has been emitted from the light source, passing through the measured film and further reflected on the upper surface of the substrate enter. The reflection suppressing unit is located separately from a lower surface of the substrate not being in contact with the stage but exposed to atmosphere, and the reflection suppressing unit suppresses a reflection of light, which enters the reflection suppressing unit from the light source, to the light receiver.

A second aspect of a technique disclosed in the specification of the present application is a film thickness measuring apparatus measuring a film thickness of a measured film formed on an upper surface of a substrate transmitting light, including: a stage supporting the substrate from below; a light source emitting light to the measured film; and a light receiver which a first light made up of light, which has been emitted from the light source, reflected on an upper surface of the measured film and a second light made up of light, which has been emitted from the light source, passing through the measured film and further reflected on the upper surface of the substrate enter. A concave portion is formed on an upper surface of the stage, the stage is in contact with a lower surface of the substrate in a region surrounding the concave portion in a planar view, and a cross-section of the concave portion has an arc-like shape.

According to the first aspect of the technique disclosed in the specification of the present application, the reflection suppressing unit located in the region surrounded by the stage in a planar view suppresses the reflection of the light which has passed through the substrate in a direction which the light receiver is located. Thus, the occurrence of the noise in the light receiver can be suppressed, and the accuracy of measuring a film thickness can be improved.

According to the second aspect of the technique disclosed in the specification of the present application, the light which has passed through the substrate can be reflected in a direction different from a direction in which the light receiver is located by the concave portion of the measurement stage. Thus, the occurrence of the noise in the light receiver can be suppressed, and the accuracy of measuring a film thickness can be improved.

These and other objects, features, aspects and advantages relating to the technique disclosed in the specification of the present application will become more apparent from the following detailed description of the present invention when taken in conjunction with the accompanying drawings.

DESCRIPTION OF THE PREFERRED EMBODIMENTS

An embodiment is described hereinafter with reference to the drawings.

The drawings are schematically illustrated, and a configuration is appropriately omitted or simplified for convenience of explanation. A mutual relationship of sizes and positions of configurations illustrated in the different drawing is not necessarily accurately illustrated, but can be appropriately changed. A hatching may be drawn in a plane view, for example, as well as a cross-sectional view to easily understand contents of the embodiment.

In the description hereinafter, the same reference numerals will be assigned to the similar constituent elements in the drawings, and the constituent elements having the same reference numeral have the same name and function. Accordingly, the detailed description on them may be omitted to avoid a repetition in some cases.

In the following description, even when terms indicating a specific position and direction such as "upper", "lower", "left", "right", "side", "bottom", "front" or "rear" are stated, the terms are used to facilitate understanding of embodiments for convenience, and therefore, irrelevant to directions in practical implementation.

Further, in the following description, even when ordinal numbers such as "first" or "second" are stated, the terms are used to facilitate understanding of embodiments, and therefore, the usage of the ordinal numbers does not limit the indication of the ordinal numbers to ordering.

First Embodiment

A film thickness measuring apparatus according to the present embodiment is described hereinafter. Described first for convenience of explanation is a case where an incident light passes through a substrate and is then reflected on an upper surface of a measurement stage, and a reflected light reaches a light receiver of a sensor.

Configuration of Film Thickness Measuring Apparatus

Figure 4:
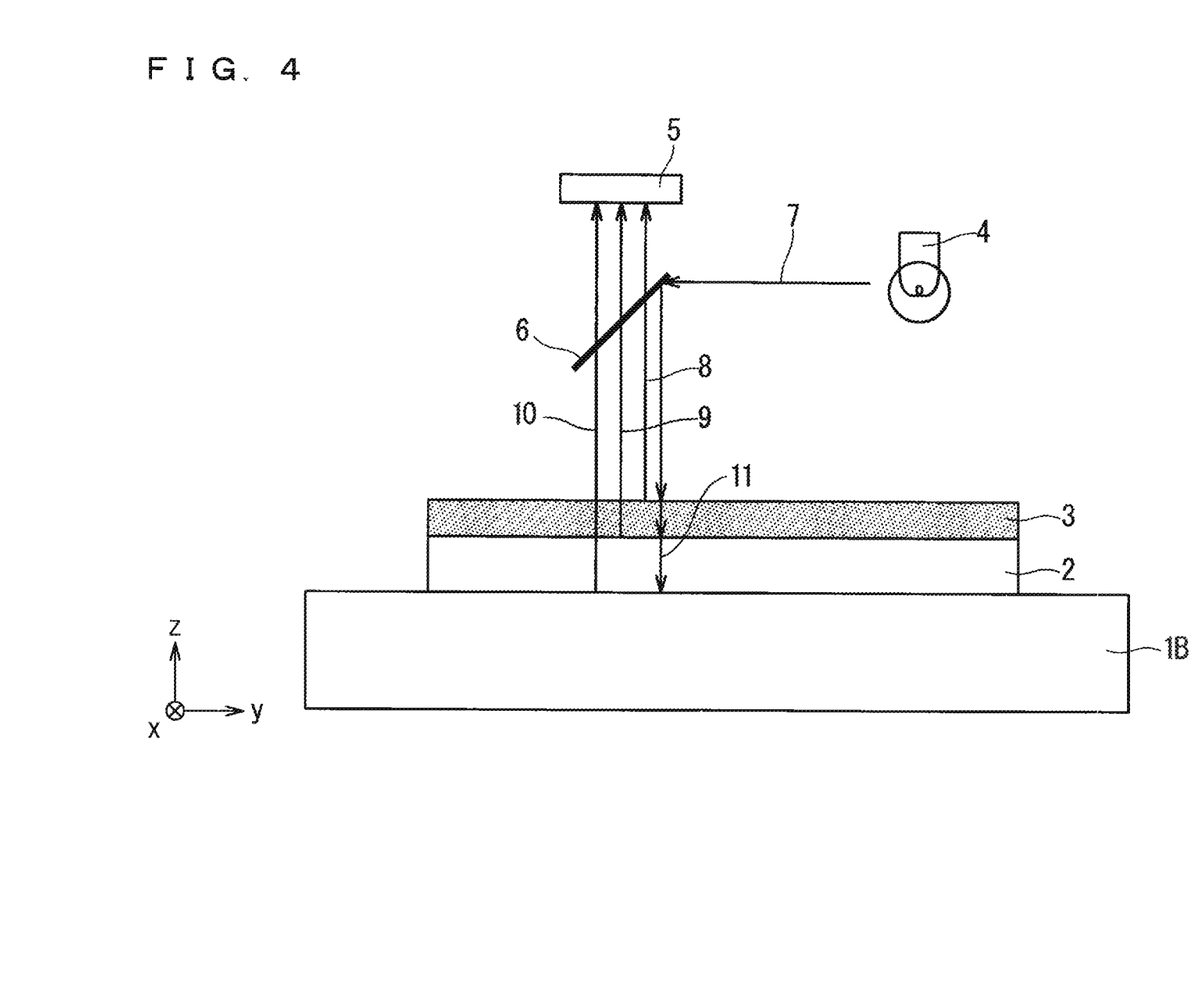
FIG. 4 is a cross-sectional view schematically showing an example of a structure of the film thickness measuring apparatus according to the embodiment, particularly the measurement unit.

FIG. 4 is a cross-sectional view schematically showing an example of a structure of a film thickness measuring apparatus according to the present embodiment, particularly a measurement unit. As illustrated in FIG. 4, the film thickness measuring apparatus includes a measurement stage 1B and a substrate 2 disposed on an upper surface of the measurement stage 1B. A measured film 3 is formed on an upper surface of the substrate 2.

The film thickness measuring apparatus includes a light source 4 disposed above the substrate 2, a half mirror 6 disposed above the substrate 2, and a light receiver 5 disposed above the substrate 2.

The measurement stage 1B is disposed to overlap with the substrate 2 in a planar view. The substrate 2 is a transparent substrate, and is an SiC substrate, for example. The light source 4 is a light source emitting a visible light and a near-infrared light (specifically having a wavelength ranging from 350 nm to 2500 nm), and a halogen lamp is used, for example.

A light 7 emitted from the light source 4 enters the half mirror 6. The light reflected on the half mirror 6 is focused by a lens (not shown in FIG. 4), and further vertically enters a micro region of the measured film 3.

The light receiver 5 is made up of a spectroscope and an image sensor such as a CCD. A light 8 reflected on the upper surface of the measured film 3, a light 9 reflected on the upper surface of the substrate 2, and a light 10 reflected on the upper surface of the measurement stage 1B enter the light receiver 5. The light receiver 5 converts a phase difference between the light 8 and the light 9 to calculate a film thickness of the measured film 3.

As illustrated in FIG. 4, if the substrate 2 is a sample made of a material which transmits a measurement light such as an SiC substrate, the light 10 reflected on the upper surface of the measurement stage 1B on which the sample is disposed enters the light receiver 5 of the sensor, thereby causing a reduction in a measurement accuracy.

Figure 1:
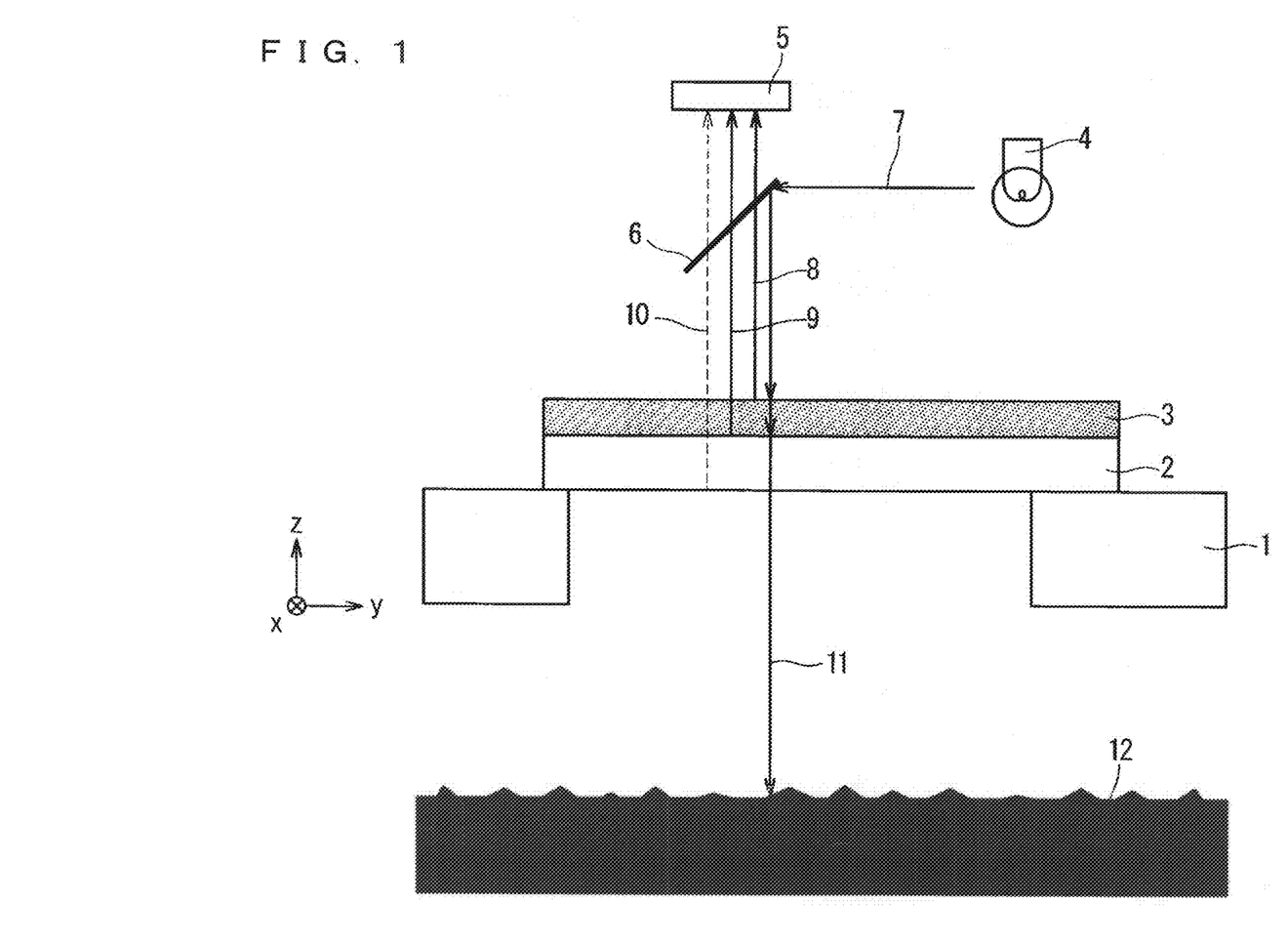
FIG. 1 is a cross-sectional view schematically showing an example of a structure of a film thickness measuring apparatus according to an embodiment, particularly a measurement unit.

FIG. 1 is a cross-sectional view schematically showing an example of a structure of the film thickness measuring apparatus according to the present embodiment, particularly the measurement unit. As illustrated in FIG. 1, the film thickness measuring apparatus includes a measurement stage 1 and the substrate 2 disposed on an upper surface of the measurement stage 1. The measured film 3 is formed on the upper surface of the substrate 2.

The film thickness measuring apparatus includes the light source 4 disposed above the substrate 2, the half mirror 6 disposed above the substrate 2, the light receiver 5 disposed above the substrate 2, and a light absorption plate 12 disposed below the substrate 2.

The measurement stage 1 has a ring shape in a planar view. An end portion of the substrate 2 is disposed to overlap with the measurement stage 1 in a planar view. In the meanwhile, a central portion of a lower surface of the substrate 2 not being in contact with the measurement stage 1 is exposed to the atmosphere. That is to say, the measurement stage 1 overlaps with the end portion of the substrate 2 in a planar view, and supports the end portion of the substrate 2. The substrate 2 is an SiC substrate, for example. The measured film 3 is an oxide film formed on an upper surface of the SiC substrate, for example.

The light source 4 is a light source emitting a visible light and a near-infrared light (specifically having a wavelength λ ranging from 350 nm to 2500 nm), and a halogen lamp is used, for example. A light 7 emitted from the light source 4 enters the half mirror 6. The light reflected on the half mirror 6 is focused by a lens (not shown in FIG. 1), and further vertically enters a micro region of the measured film 3.

The light receiver 5 is made up of a spectroscope and an image sensor such as a CCD. A light 8 reflected on the upper surface of the measured film 3 and the light 9 reflected on the upper surface of the substrate 2 mainly enter the light receiver 5. The light receiver 5 converts a phase difference between the light 8 and the light 9 to calculate the film thickness of the measured film 3.

The light absorption plate 12 has optical absorbability on a wavelength region of the light entered for measuring the film thickness. The light absorption plate 12 is separately disposed below the measurement stage 1. That is to say, the light absorption plate 12 is located separately from the measurement stage 1 and the substrate 2. At least a part of the light absorption plate 12 is located in a region surrounded by the measurement stage 1 in a planar view. Since the measurement stage 1 and the light absorption plate 12 which is separately disposed are detachably provided in the film thickness measuring apparatus, maintainability of the film thickness measuring apparatus is improved.

A light absorption coating having a rough surface is applied on the light absorption plate 12. The rough surface may have an acute angle or obtuse angle, or may be rounded. The coating having the rough surface or a base member for the coating having the rough surface may be applied to form the light absorption coating having the rough surface.

According to the film thickness measuring apparatus configured in such a manner, in a case where the light 7 emitted from the light source 4 is reflected on the half mirror 6 and further passes through the measured film 3 and the substrate 2, the substrate 2 and the measurement stage 1 do not overlap with each other in a planar view in a position which the light 7 enters by reason that the measurement stage 1 has the ring shape in a planar view. Thus, the light 10 reflected on the upper surface of the measurement stage 1 is not generated.

Since an area of the measurement stage 1 in reduced by reason that the measurement stage 1 has the ring shape in a planar view, a deposition of particles on the upper surface of the measurement stage 1 can be suppressed.

The measurement stage 1 can be moved in a direction parallel with a surface of a measured sample (the measured film 3 formed on the upper surface of the substrate 2 in FIG. 1) (that is to say, an X axis direction and a Y axis direction in FIG. 1). Thus, the light 7 can be made to enter an optional position in the measured film 3 to measure the film thickness.

In the meanwhile, a light 11 which has passed through the substrate 2 enters the light absorption plate 12 disposed below the measurement stage 1, and is then absorbed by the light absorption plate 12.

This configuration can suppress the light 11, which has passed through the substrate 2, reflected and entering the light receiver 5 as the light 10, thereby being able to suppress a noise occurring in the light receiver 5.

The area in the light absorption plate 12 receiving the light 11 which has passed through the substrate 2 is increased by applying the light absorption coating having the rough surface on the upper surface of the light absorption plate 12, thus a light absorption efficiency can be increased.

Figure 2:
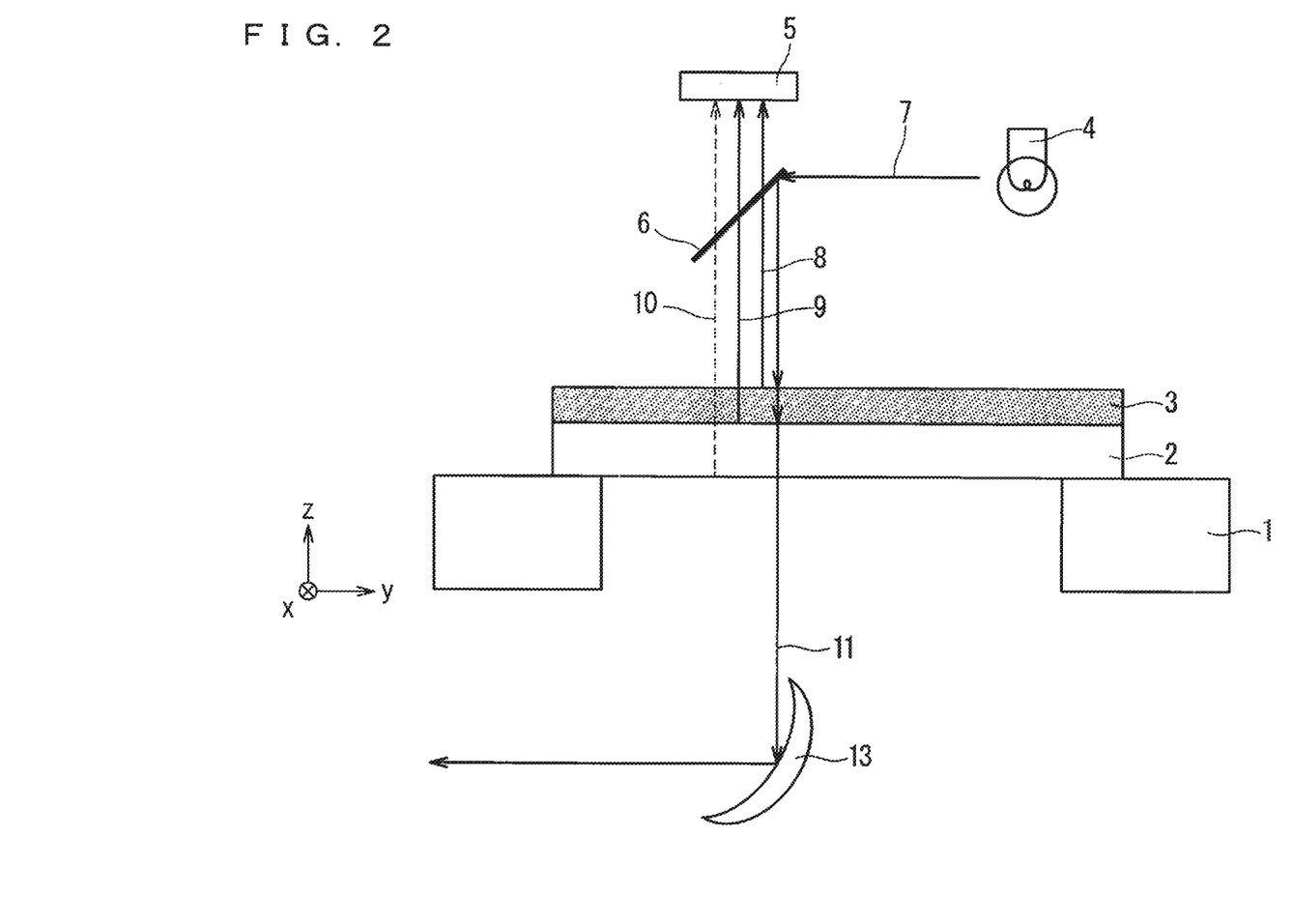
FIG. 2 is a cross-sectional view schematically showing a modification example of a structure of the film thickness measuring apparatus according to the embodiment, particularly the measurement unit.

FIG. 2 is a cross-sectional view schematically showing a modification example of the structure of the film thickness measuring apparatus according to the present embodiment, particularly the measurement unit. As illustrated in FIG. 2, the film thickness measuring apparatus includes the measurement stage 1, the substrate 2, the light source 4, the half minor 6, the light receiver 5, and a concave mirror 13 disposed below the substrate 2. The measured film 3 is formed on the upper surface of the substrate 2.

The concave mirror 13 is located separately from the measurement stage 1 and the substrate 2 below the measurement stage 1. The concave mirror 13 is located in a region surrounded by the measurement stage 1 in a planar view. The concave mirror 13 reflects the light 11 which has passed through the substrate 2 in a direction different from a Z axis positive direction in FIG. 2 such as a Y axis negative direction, for example. A flat mirror may be provided instead of the concave minor 13.

The concave mirror 13 provided in such a manner can suppress the light 11, which has passed through the substrate 2, reflected and entering the light receiver 5 as the light 10, thereby being able to suppress a noise occurring in the light receiver 5.

Second Embodiment

A film thickness measuring apparatus according to the present embodiment is described. In the description hereinafter, the same reference numerals as those described in the above embodiment will be assigned to the similar constituent elements in the drawings, and detailed description thereof is appropriately omitted.

Configuration of Film Thickness Measuring Apparatus

Figure 3:
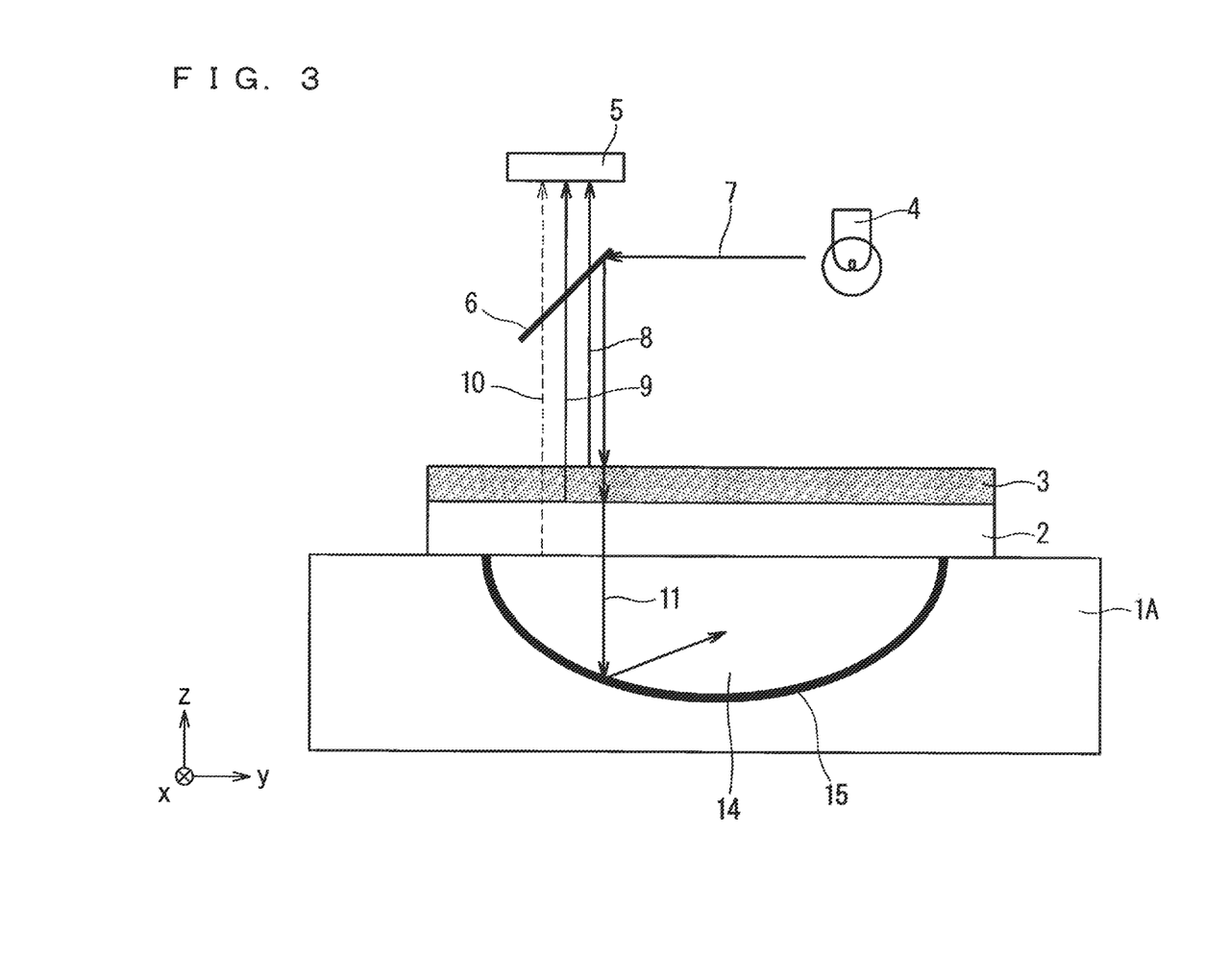
FIG. 3 is a cross-sectional view schematically showing an example of a structure of the film thickness measuring apparatus according to the embodiment, particularly the measurement unit.

FIG. 3 is a cross-sectional view schematically showing an example of a structure of the film thickness measuring apparatus according to the present embodiment, particularly the measurement unit. As illustrated in FIG. 3, the film thickness measuring apparatus includes a measurement stage 1A, the substrate 2, the light source 4, the half minor 6, and the light receiver 5. The measured film 3 is formed on the upper surface of the substrate 2.

The measurement stage 1A is disposed to overlap with the substrate 2 in a planar view. However, an arc-like concave portion 14 is formed in a central portion of an upper surface of the measurement stage 1A, and the lower surface of the substrate 2 and the upper surface of the measurement stage 1A are in contact with each other in a region surrounding the concave portion 14 in a planar view. That is to say, the measurement stage 1A overlaps with the whole substrate 2 in a planar view, and supports only the end portion of the substrate 2. A part of the lower surface of the substrate 2 facing the concave portion 14 is not in contact with the upper surface of the measurement stage 1A but exposed to the atmosphere.

The measurement stage 1A can be moved in a direction parallel with a surface of a measured sample (the measured film 3 formed on the upper surface of the substrate 2 in FIG. 3) (that is to say, the X axis direction and the Y axis direction in FIG. 3). Thus, the Eight 7 can be made to enter an optional position in the measured film 3 to measure the film thickness.

Since the measurement stage 1A is detachably provided in the film thickness measuring apparatus, maintainability of the film thickness measuring apparatus is improved.

As illustrated in FIG. 3, a cross-section of the concave portion 14 has an arc-like shape, specifically a hemispherical shape. The cross-section of the concave portion 14 may have not only an exact circular shape but also an elliptical shape.

According to the film thickness measuring apparatus configured in such a manner, in the case where the light 7 emitted from the light source 4 is reflected on the half mirror 6 and further passes through the measured film 3 and the substrate 2, the light 11 which has passed through the substrate 2 enters the concave portion 14 formed below the substrate 2, and is then reflected in a direction different from a Z axis positive direction in FIG. 3 such as a Y axis positive direction, for example.

This configuration can suppress the light 11, which has passed through the substrate 2, reflected and entering the light receiver 5 as the light 10, thereby being able to suppress a noise occurring in the light receiver 5.

A light absorption coating 15 having a rough surface may be applied on an inner wall of the concave portion 14 as illustrated in FIG. 3. The rough surface may have an acute angle or obtuse angle, or may be rounded. The coating having the rough surface or a base member for the coating having the rough surface may be applied to form the light absorption coating having the rough surface. The light absorption coating 15 of the concave portion 14 has optical absorbability on a wavelength region of the light emitted for measuring the film thickness.

Since the light absorption coating 15 having the rough surface is applied on the surface of the inner wall of the concave 14, the light 11 which has passed through the substrate 2 can be absorbed in the concave portion 14. The area in the concave portion 14 receiving the light 11 which has passed through the substrate 2 is increased by applying the light absorption coating 15 having the rough surface, thus a light absorption efficiency can be increased.

Since the light 10 entering the light receiver 5 can be further reduced, a noise occurring in the light receiver 5 can be reduced.

Effect Resulting From Embodiments Described Above

Described next is an example of an effect resulting from the embodiments described above. It should be noted that, in the following description, effects are described based on the specific configurations illustrated in the above described embodiments, however, other specific configurations may be applied in place of the configurations illustrated in the specification, within the scope of producing the similar effects.

Also, the replacement may be implemented with a plurality of embodiments. That is to say, each of the configurations illustrated in the corresponding embodiments may be combined with one another to produce the similar effects.

According to the embodiment described above, the film thickness measuring apparatus measures the film thickness of the measured film 3 formed on the upper surface of the substrate 2 which transmits the light. The film thickness measuring apparatus includes a stage, a reflection suppressing unit, the light source 4, and the light receiver 5. Herein, the stage corresponds to the measurement stage 1, for example. The reflection suppressing unit corresponds to at least one of the light absorption plate 12 and the concave mirror 13, for example. The measurement stage 1 is in contact with only the end portion of the substrate 2 in a planar view, and supports the substrate 2 from below. The reflection suppressing unit is located separately from the measurement stage 1 below the measurement stage 1. At least a part of the reflection suppressing unit is located in a region surrounded by the measurement stage 1 in a planar view. The light source 4 emits the light to the measured film 3. A first light made up of the light, which has been emitted from the light source 4, reflected on the upper surface of the measured film 3 and a second light made up of the light, which has been emitted from the light source 4, passing through the measured film 3 and further reflected on the upper surface of the substrate 2 enter the light receiver 5. Herein, the first light corresponds to the light 8, for example. The second light corresponds to the light 9, for example. The reflection suppressing unit is located separately from a part of the lower surface of the substrate 2 not being contact with the measurement stage 1 but exposed to the atmosphere. The reflection suppressing unit suppresses the reflection of the light, which enters the reflection suppressing unit from the light source 4, to the light receiver 5.

According to this configuration, the reflection suppressing unit located in the region surrounded by the measurement stage 1 in a planar view suppresses the reflection of the light 11 which has passed through the substrate 2, which is the transparent substrate, in a direction which the light receiver 5 is located. Thus, the occurrence of the noise in the light receiver 5 can be suppressed, and an accuracy of measuring a film thickness can be improved. The reflection suppressing unit is located separately from the measurement stage 1 below the measurement stage 1. Since the light absorption plate 12 and the concave mirror 13 are detachably provided in the film thickness measuring apparatus, maintainability of the film thickness measuring apparatus is improved.

It should be noted that the description of the other configurations other than the configurations illustrated in the specification of the present application can be appropriately omitted. That is to say, as long as the described configurations are provided, the above described effects can be produced.

However, even in the case where at least one of the other configurations other than the configurations illustrated in the specification of the present application is appropriately added to the configuration described above, that is to say, other configurations other than the configurations illustrated in the specification of the present application, which are not referred to as configurations described above are appropriately added, the similar effects can be produced.

According to the embodiment described above, the measurement stage 1 has the ring shape in a planar view. According to this configuration, the measurement stage 1 does not overlap with the central portion of the substrate 2 in a planar view, thus the light 10 reflected on the upper surface of the measurement stage 1 does not occur in the central portion of the substrate 2. Thus, the occurrence of the noise in the light receiver 5 can be suppressed, and an accuracy of measuring a film thickness can be improved.

According to the embodiment described above, the light absorption coating having the rough surface is applied on the upper surface of the light absorption plate 12. According to this configuration, the light 11 which has passed through the substrate 2, which is the transparent substrate, is absorbed by the light absorption plate 12 provided below the measurement stage 1. Thus, the occurrence of the noise in the light receiver 5 can be suppressed, and the accuracy of measuring a film thickness can be improved.

According to the embodiment described above, the reflection suppressing unit is the concave mirror 13. According to this configuration, the light 11 which has passed through the substrate 2, which is the transparent substrate, can be reflected in the direction different from the direction in which the light receiver 5 is located by the concave mirror 13 provided below the measurement stage 1. Thus, the occurrence of the noise in the light receiver 5 can be suppressed, and the accuracy of measuring a film thickness can be improved.

According to the embodiment described above, the film thickness of the measured film 3 formed on the upper surface of the substrate 2 which transmits the light is measured. The film thickness measuring apparatus includes the stage, the light source 4, and the light receiver 5. Herein, the stage corresponds to the measurement stage 1A, for example. The measurement stage 1A supports the substrate 2 from below. The light source 4 emits the light to the measured film 3. The light 8, which has been emitted from the light source 4, reflected on the upper surface of the measured film 3 and the light 9, which has been emitted from the light source 4, passing through the measured film 3 and further reflected on the upper surface of the substrate 2 enter the light receiver 5. The concave portion 14 is formed on the upper surface of the measurement stage 1A. The measurement stage 1A is in contact with the lower surface of the substrate 2 in the region surrounding the concave portion 14 in a planar view. The cross-section of the concave portion 14 has the arc-like shape.

According to this configuration, the light 11 which has passed through the substrate 2, which is the transparent substrate, can be reflected in the direction different from the direction in which the light receiver 5 is located by the concave portion 14 of the measurement stage 1A. Thus, the occurrence of the noise in the light receiver 5 can be suppressed, and the accuracy of measuring a film thickness can be improved. Since the cross-section of the concave portion 14 has the arc-like shape, the deposition of particles in the concave portion 14 can be suppressed.

It should be noted that the description of the other configurations other than the configurations illustrated in the specification of the present application can be appropriately omitted. That is to say, as long as the described configurations are provided, the above described effects can be produced.

However, even in the case where at least one of the other configurations other than the configurations illustrated in the specification of the present application is appropriately added to the configuration described above, that is to say, other configurations other than the configurations illustrated in the specification of the present application, which are not referred to as configurations described above are appropriately added, the similar effects can be produced.

According to the embodiment described above, the part of the lower surface of the substrate 2 facing the concave portion 14 is exposed to the atmosphere. According to this configuration, the light 11 which has passed through the substrate 2, which is the transparent substrate, can be reflected in the direction different from the direction in which the light receiver 5 is located by the concave portion 14 of the measurement stage 1A.

According to the embodiment described above, the light absorption coating 15 having the rough surface is applied on the inner wall of the concave portion 14. According to this configuration, the light 11 which has passed through the substrate 2, which is the transparent substrate, can be reflected in the direction different from the direction in which the light receiver 5 is located by the concave portion 14 of the measurement stage 1A. Since the light absorption coating 15 having the rough surface is applied on the inner wall of the concave 14, the light 11 which has passed through the substrate 2 can be effectively absorbed in the concave portion 14. Thus, the occurrence of the noise in the light receiver 5 can be further suppressed, and the accuracy of measuring a film thickness can be improved.

Modification Example in Embodiments Described Above

In Embodiments described above, material properties, materials, dimensions, shapes, relative arrangement relations, conditions for implementation, and so forth for the respective constituent elements may be described, however, these represent a mare example in all aspects, and are not limited to the description in the specification of the present application.

Accordingly, it is understood that numerous other modifications variations, and equivalents can be devised without departing from the scope of the technique disclosed in the specification of the present application. For example, the following cases where at least one of the constituent elements is to be modified, added, or omitted, further, at least one of the constituent elements of at least one of the embodiments is extracted and then combined with constituent elements of the other embodiment, are involved.

The "one" constituent element described in the above embodiments may be "one or more" constituent elements so far as consistent with the embodiments.

Further, individual constituent elements are conceptual units. Thus, within the range of the technique disclosed in the specification of the present application, one constituent element may include multiple structures, one constituent element may correspond to part of some structure, and multiple constituent elements may be included in one structure.

Each constituent element includes a structure having a different configuration or a different shape as long as the structure of the different configuration or the different shape achieves the same function.

What has been described in the specification of the present application is referred for all purposes regarding the present technique. It is thus not an admission that any of the descriptions provided herein are conventional techniques.

Further, in the embodiments described above, when names of materials are stated unless otherwise specified, an alloy of the material and other additives, and so forth are included, so far as consistent with the embodiments.

While the invention has been shown and described in detail, the foregoing description is in all aspects illustrative and not restrictive. It is therefore understood that numerous modifications and variations can be devised without departing from the scope of the invention.

What is claimed is:

1. A film thickness measuring apparatus measuring a film thickness of a measured film formed on an upper surface of a substrate transmitting light, comprising:
   a stage being in contact with only an end portion of the substrate in a planar view and supporting the substrate from below;
   a reflection suppressor located separately from the stage below the stage, at least a part of the reflection suppressor located in a region surrounded by the stage in a planar view;
   a light source emitting light to the measured film, a first light of the emitted light reflecting from an upper surface of the measured film, a second light of the emitted light passing through the measured film to reflect from the upper surface of the substrate, and a third light of the emitted light transmitting through the substrate to the reflection suppressor; and
   a light receiver configured to receive the first light and the second light, wherein the reflection suppressor is located separately from a lower surface of the substrate not being in contact with the stage but exposed to atmosphere, and the reflection suppressor is configured to suppress a reflection of the third light from the reflection suppressor to the light receiver.

2. The film thickness measuring apparatus according to claim 1, wherein the stage has a ring shape in a planar view.

3. The film thickness measuring apparatus according to claim 1, wherein a light absorption coating having a rough surface is formed on the upper surface of the reflection suppressor.

4. The film thickness measuring apparatus according to claim 1, wherein the reflection suppressor is a concave mirror.

5. The film thickness measuring apparatus according to claim 1, including a mirror positioned to reflect light from the light source onto the measured film.

6. The film thickness measuring apparatus according to claim 5, wherein the mirror is a half mirror.

7. A film thickness measuring apparatus measuring a film thickness of a measured film formed on an upper surface of a substrate transmitting light, comprising:

a stage supporting the substrate from below;

a light source emitting light to the measured film, the emitted light including a first light reflecting from an upper surface of the measured film, and a second light passing through the measured film to reflect from the upper surface of the substrate; and a light receiver configured to receive the first light and the second light, wherein a concave portion is formed on an upper surface of the stage, the stage is in contact with a lower surface of the substrate in a region surrounding the concave portion in a planar view, and a cross-section of the concave portion has an arc-like shape.

8. The film thickness measuring apparatus according to claim 7, wherein a part of the lower surface of the substrate facing the concave portion is exposed to atmosphere.

9. The film thickness measuring apparatus according to claim 7, wherein a light absorption coating having a rough surface is formed on an inner wall of the concave portion.

10. The film thickness measuring apparatus according to claim 7, including a mirror positioned to reflect light from the light source onto the measured film.

11. The film thickness measuring apparatus according to claim 10, wherein the mirror is a half mirror.

* * * * *